United States Patent
Ferbitz et al.

(10) Patent No.: US 7,045,273 B2
(45) Date of Patent: May 16, 2006

(54) PROCESS FOR SILYLATING PHOTORESISTS IN THE UV RANGE

(75) Inventors: Jens Ferbitz, Siegen (DE); Werner Mormann, Siegen (DE); Jens Rottstegge, Lilienthal (DE); Christoph Hohle, Bubenreuth (DE); Christian Eschbaumer, Schwaig (DE); Michael Sebald, Weisendorf (DE)

(73) Assignee: Infineon Technologies AG, Munich (DE)

( * ) Notice: Subject to any disclaimer, the term of this patent is extended or adjusted under 35 U.S.C. 154(b) by 39 days.

(21) Appl. No.: 10/285,050

(22) Filed: Oct. 31, 2002

(65) Prior Publication Data

US 2003/0124468 A1 Jul. 3, 2003

(30) Foreign Application Priority Data

Oct. 31, 2001 (DE) .............................. 101 53 497

(51) Int. Cl.
*G03F 7/20* (2006.01)
*G03F 7/30* (2006.01)
*G03F 7/40* (2006.01)
*G03F 7/39* (2006.01)
*B01J 31/02* (2006.01)

(52) U.S. Cl. ..................... 430/296; 430/311; 430/315; 430/270.1; 430/324; 430/326; 430/330; 502/167

(58) Field of Classification Search .............. 430/296, 430/311, 313, 315, 330, 270.1, 323–326, 430/328
See application file for complete search history.

(56) References Cited

U.S. PATENT DOCUMENTS

| | | | | | |
|---|---|---|---|---|---|
| 4,491,628 A | * | 1/1985 | Ito et al. | ...................... | 430/176 |
| 5,173,393 A | * | 12/1992 | Sezi et al. | ................... | 430/323 |
| 5,234,793 A | * | 8/1993 | Sebald et al. | ............... | 430/323 |
| 5,234,794 A | | 8/1993 | Sebald et al. | ............... | 430/325 |
| 5,250,375 A | | 10/1993 | Sebald et al. | ................... | 430/8 |
| 5,650,261 A | * | 7/1997 | Winkle | ..................... | 430/270.1 |
| 2002/0068808 A1 | * | 6/2002 | Kometani et al. | ............ | 528/54 |
| 2002/0146638 A1 | * | 10/2002 | Ito et al. | .................. | 430/270.1 |
| 2003/0073043 A1 | | 4/2003 | Rottstegge et al. | ......... | 430/322 |

FOREIGN PATENT DOCUMENTS

JP 11338155 A 12/1999

OTHER PUBLICATIONS

Kleimann, Helmut, Die Angewandte Makromoleculare Chemie, 98 (1981), pp. 185-194 (No. 1580), Bayer AG, Polyurethan-Anwendungstechnik, D-5090 Leverkusen, translated title: Basically Catalyzed Isocyanate—Amine Reaction.*

(Continued)

*Primary Examiner*—Mark F. Huff
*Assistant Examiner*—John Ruggles
(74) *Attorney, Agent, or Firm*—Laurence A. Greenberg; Werner H. Stemer; Ralph E. Locher (57) ABSTRACT

A process for the amplification of structured resists utilizes a reaction between a nucleophilic group and an isocyanate group or thiocyanate group to link an amplification agent to a polymer present in the photoresist. The isocyanate group or the thiocyanate group in addition to the nucleophilic group form a reaction pair. One of the partners is provided on the polymer and the other partner on the amplification agent. The amplification reaction takes place more rapidly than a linkage to carboxylic anhydride groups. Furthermore, the amplification reaction permits the use of polymers that have high transparency at short wavelengths of less than 200 nm, in particular 157 nm.

10 Claims, 3 Drawing Sheets

OTHER PUBLICATIONS

Helmut Kleimann: "Die basenkatalysierte Isocyanat-Amin-Reaktion"[a base catalyzed isocyanate amino reaction], *Die Angewandte Makromolekulare Chemie*, vol. 98, 19981, pp. 185-194 (No. 1580).

* cited by examiner

PROCESS FOR SILYLATING PHOTORESISTS IN THE UV RANGE

BACKGROUND OF THE INVENTION

Field of the Invention

The invention relates to a process for the amplification of structured resists as used in the production of microelectronic components.

In order to increase the computational speed of processors and the storage volume of storage elements and to reduce the costs of the components, the semiconductor industry is developing chips that have increasingly small structures and hence an increasingly high density of components. A particular challenge is the reduction of the minimum structure size. Optical lithography has met these requirements by changing over to shorter and shorter wavelengths. However, in the case of a structure size of from 100 to 70 nm, the methods known to date, which use wavelengths down to 193 nm, have reached the limit of their resolution. Therefore, it is necessary to develop novel methods. Optical lithography has particularly good prospects for use in industry. In particular, the industry prefers to continue to use radiation having a wavelength of 157 nm because the chip manufacturers can continue to utilize their extensive knowledge in optical lithography. A substantial difficulty with the use of an exposure radiation having a wavelength of 157 nm is the unsatisfactory transparency of the materials used to date. For industrial use, the base polymer in these high-resolution resists must have as high transparency as possible, while the photosensitive chemicals with which, for example, an acid is produced in the resist must have a high quantum yield.

Some of the resists currently used for the production of microchips operate with chemical amplification. Exposure in a photochemical reaction changes the chemical structure of the photoresist. Characteristic for a chemically amplified resist is a quantum yield greater than one (>1). In non-chemically amplified resists, not more than one acid-labile group per light quantum is cleaved. The quantum yield may therefore be one at the most. In the case of chemically amplified resists, a multiplicity of acid-labile groups can be cleaved with one light quantum. Therefore, Quantum yields of more than one hundred (>100) are possible. In the case of a positive-working chemically-amplified resist, the exposure produces a strong acid that catalytically converts or cleaves the resist in a subsequent heating step. As a result of this chemical reaction, the solubility of the polymer in a developer is dramatically changed so that a substantial differentiation between exposed and unexposed parts is possible.

The structured photoresists can be used as a mask for further processes, such as, for example, dry etching processes. If an organic chemical medium located underneath, for example in two-layer resists, is structured using the photoresist, the photoresist disposed as the uppermost layer must have high resistance to etching. For this purpose, either the photoresist may have appropriate groups of the polymer chain, for example silicon-containing groups, or the etch resistance of the photoresist is increased in a step following the structuring of the photoresist. For this purpose, reactive groups must be present as anchor groups in the polymer. These then react with a suitable reactive group of an amplification reagent, which group acts as a linkage group, with formation of a chemical bond. In this way, silicon-containing groups can be introduced subsequently into the polymer. The etch resistance of organosilicon compounds in oxygen plasma is substantially higher compared with aliphatic organic hydrocarbon compounds. Particularly for resist structures having a small layer thickness, subsequent amplification of the resist structures is therefore advantageous. The reaction for incorporating organosilicon compounds is often referred to as silylation.

A process for the amplification of resist structures is described, for example, in commonly-assigned European Patent No. EP 0 395 917 B1, which corresponds to U.S. Pat. Nos. 5,234,794 and 5,234,793. There, the photoresists used for exposure wavelengths of 248 and 193 nm are structured and then chemically amplified in their etch resistance by the incorporation of organosilicon groups and thus form a sufficiently stable etch resist. For this purpose, the film-forming polymer of the photoresist includes reactive groups, for example anhydride groups. These anhydride groups react with basic groups of the silylating solution, which contains, for example, bifunctional aminosiloxanes, amide bonds being formed between polymer and silylating agent with crosslinking of the resist structure. Finally, a suitable wash solution washes away excess silylating agent. Resists as used for exposure to radiation having a wavelength of 248 to 193 nm permit layer thicknesses in the range from 140 to 200 nm. The amplification agent increases a volume in the horizontal and vertical direction during the silylation. A narrowing of trenches of the resist structure and hence an improvement in the resolution are therefore possible. This narrowing of trenches is referred to as "CARL" (Chemical Amplification of Resist Lines).

As already mentioned, the low transparency of the known photoresists at a wavelength of 157 nm is a substantial difficulty in the development of 157 nm technology. The high proportion of anhydride groups contributes decisively to the high absorption of the polymers used for the 193 nm technology at shorter wavelengths. Some chemically amplifiable photoresists have a proportion of up to 50% of anhydride groups. A further problem of silylation is the frequently low rate of the reaction, which therefore sometimes requires high concentrations of organosilicon compounds. The reaction rate of the silylation and hence the film thickness increase rise with increasing solubility or swellability of the polymer in polar solvents. In order to permit a sufficient reaction rate or a sufficient film thickness increase, the silylating agent must be able to penetrate sufficiently deeply into the resist structure in order to be able to reach the reactive groups of the polymer and to be linked there to the polymer by an appropriate reaction. At the same time, the resist structure may not be dissolved during the amplification reaction to such an extent that the previously produced structure is lost.

SUMMARY OF THE INVENTION

It is accordingly an object of the invention to provide a process for silylating photoresists in the UV range that overcomes the hereinafore-mentioned disadvantages of the heretofore-known processes of this general type and that amplifies resist structures to increase the layer thickness of an already structured photoresist for the 157 nm technology.

With the foregoing and other objects in view, there is provided, in accordance with the invention, a process for the amplification of structured resists including the following steps.

(a) Applying a chemically amplified photoresist to a substrate. The photoresist contains the following components. A polymer including acid-labile groups that are eliminated upon the action of acid and liberate groups that increase the solubility of the polymer in aqueous alkaline developers, and which furthermore include anchor groups for the linkage of amplification agents. The anchor groups can be present in the form of a protected anchor group. The photoresist also contains a photo acid generator and a solvent.

(b) Drying the photoresist to give a dried resist film.

(c) Structuring the resist film to give a structured resist.

(d) Optionally, liberating the anchor groups from the protected anchor groups.

(e) Applying an amplification agent to the structured resist. The amplification agent includes at least one silicon-containing group and at least one linkage group for the linkage of the amplification agent to the anchor group of the polymer, so that the anchor group and the linkage group react with one another the for formation of a chemical bond and a covalent bond links the amplification agent to the polymer.

(h) Removing excess amplification agent.

The linkage group and anchor group form a pair formed from a group of the structure —N=C=X, where X=O or S, on the one hand, and a nucleophilic group on the other hand.

The process according to the invention uses the isocyanate group —N=C=O or the thiocyanate group —N=C=S as the group susceptible to nucleophilic attack. In comparison with the carboxylic anhydride group, these groups have higher reactivity so that the reaction rate and hence the film thickness increase can be increased compared with the carboxylic anhydride-containing polymers customary to date, or lower concentrations of silylating solution can be employed. A rapid, complete reaction is particularly advantageous with very thin resists where the dry etch resistance has to be particularly greatly increased. Furthermore, the isocyanate group and the thiocyanate group have about 50% lower absorption for radiation of a wavelength of less than 160 nm compared with the carboxylic anhydride group. A further advantage that results from this is that the transparency of the polymer contained in the resist can also be increased at low wavelengths in comparison with anhydride-containing polymers, which permits an increase in the layer thickness of the photoresist. The reaction occurring in the process according to the invention is shown below:

The letters A and B represent the polymer contained in the resist and the silicon-containing amplification agent, respectively. The isocyanate group (X=O) or the thiocyanate group (X=S) can therefore be present either on the polymer or on the amplification agent in the process according to the invention. As a complement to this, the nucleophilic group is present on the amplification agent or on the polymer. Z represents the nucleophilic group that attacks the isocyanate group or the thiocyanate group with formation of a covalent bond.

In the first step of the process, a chemically amplified photoresist is applied to a substrate, usually a silicon wafer, which may also have been structured in prior process steps, and in which electronic components may already have been integrated. It is also possible to use multilayer resists, the photoresist then forming the uppermost layer. Multilayer resists permit better focusing of the beam used for exposure onto the surface of the substrate.

"The film-forming polymer contains, in the chain or as side groups, acid-labile groups that decrease the solubility of the polymer in polar solvents. Through the catalytic action of acid and, if required, a simultaneous thermal treatment, polar groups are produced on the polymer. For example, the following groups may be used as acid-labile groups: tert-alkyl ester, tert-butyl ester, tert-butoxycarbonyloxy, tetrahydrofuranyloxy, tetrahydropyranyloxy, tert-butyl ether, lactone, or acetal groups. Copolymerization of suitable monomers that include the acid-labile groups can introduce the acid-labile groups into the polymer. Preferably, used monomers here are those that have repeating units in the polymer with high transparency at short wavelengths, for example of 157 nm. Such repeating units have, for example, hydrocarbon groups in which fluorine atoms have replaced some or all of the hydrogen atoms. For example, carboxyl groups or in particular acidic hydroxyl groups are suitable as polar groups that are liberated after cleavage of the acid-labile group. Some repeating units that result in increased transparency of the polymer at short wavelengths of less than 200 nm, preferably less than 160 nm, in particular 157 nm, are shown as typical examples of a large number of suitable, repeating units."

$R^1$ is —H, —$CH_3$, —$CF_3$, or —CN and n is an integer from 1 to 10.

These repeating units can be introduced, for example, by free radical (co)polymerization of the corresponding unsaturated monomers. The hydroxyl group of the repeating unit may be etherified, for example with a tert-butyl group, in order to obtain the acid-labile groups described above. However, acetals are also suitable.

All compounds that liberate acid on exposure to radiation may be used as photo acid generators. Onium compounds, as described, for example, in European Patent Application No. EP 0 955 562, are advantageously used.

For example, methoxypropyl acetate, cyclopentanone, cyclohexanone, γ-butyrolactone, ethyl lactate, diethylene glycol diethyl ether, diethylene glycol dimethyl ether or a mixture of at least two of these compounds may be used as a solvent of the resist. In general, however, it is possible to use all customary solvents or mixtures thereof that are capable of taking up the resist components to give a clear, homogeneous solution having a long shelf life and that ensure a good layer quality when the substrate is coated.

The resist generally has the following composition: film-forming polymer, 1–50% by weight, preferably 2–10% by weight; photo acid generator, 0.01–10% by weight, preferably 0.01–0.1% by weight; and solvent, 50–99% by weight, preferably 88–97% by weight.

In addition to the compounds, the photoresist may contain further components. For example, additives that increase the quantum yield on liberation of the acid may be contained. Furthermore, it is possible to include additives that influence the resist system advantageously with respect to resolution, film formation properties, shelf life, service life effect, etc.

The photoresist is applied to the substrate by customary methods, for example by spin coating, spraying, or immersing. After application of the photoresist, the solvent is removed. For this purpose, the substrate with the applied photoresist is heated so that the solvent evaporates. If necessary, the drying step may also be carried out under reduced pressure.

The dried resist film is now structured in a customary manner. For this purpose, a latent image of the desired structure, which contains, in the exposed parts, the acid liberated from the photo acid generator, is first produced in the resist film by selective irradiation with the aid of a photomask or by direct irradiation with focused electrons or ions. In a heating step following the exposure (post exposure bake "PEB"), the acid-labile groups on the polymer are cleaved and polar groups are liberated by the catalytic effect of the acid produced by the exposure. In the exposed parts, the resist film therefore becomes soluble in an alkaline developer. In the subsequent development step, a 2.38% strength solution of tetramethylammonium hydroxide in water dissolves the exposed parts of the substrate and a positive relief pattern is thus produced in the resist film. In the exposed parts, the substrate is now bare; whereas the solid resist film protects the unexposed parts.

If anchor groups for linking the amplification agent are already available in the polymer, the amplification of the structured resist can be carried out directly after the structuring. If the anchor groups are present in protected form, they must first be liberated before the amplification. Thus, for example, the polar groups that can be liberated from the acid-labile groups can also act as anchor groups for linking the amplification agent. In this case, the structured resist can first be exposed to a floodlight in order to liberate acid from the photo acid generator in the unexposed parts too. Heating is then carried out so that the acid-labile groups of the polymer are cleaved and the polar groups, for example a hydroxyl group, are available for the amplification.

In a further embodiment of the invention, the photoresist contains, as an additional component, a thermo acid generator. The thermo acid generator must be such that it remains substantially stable at temperatures that are reached during evaporation of the solvent after application of the photoresist or at the temperature used in the PEB step. The liberation of the acid from the thermo acid generator is generally performed at temperatures of from 80 to 200° C.

Suitable thermo acid generators are, for example, benzylthiolanium compounds. The acid liberated from the thermo acid generator cleaves the acid-labile groups in the unexposed sections of the resist, which remain on the substrate. In this case too, after elimination of the acid-labile groups, nucleophilic anchor groups to which the amplification agent can be linked are available in the film-forming polymer.

For the amplification of the structured resist, the amplification agent can be deposited from the gas phase on the structured resist. Preferably, however, the amplification agent is added as a solution to the structured resist. The solvent must dissolve the amplification agent or must be capable of forming an emulsion with it. The structured resist may be insoluble or only sparingly soluble in the solvent. However, it is desirable for the solvent of the amplification agent to be able to swell the structured resist so that the amplification agent can also diffuse into deeper layers of the resist and produce amplification of the structured resist there. If the swellability of the resist in the solvent used for the amplification is too low, appropriate swelling promoters may be used. Swelling promoters are low-molecular-weight compounds that generally have polar properties. In certain cases, however, nonpolar swelling promoters may also be used. Examples of suitable swelling promoters are low-molecular-weight ethers, esters, halogenated solvents, silanes or siloxanes, which do not themselves react with reactive groups on the polymer or on the amplification agent. Examples of suitable solvents for the amplification agent are methoxypropyl acetate, cyclopentanone, cyclohexanone, toluene, heptane, decane or a mixture of at least two of these solvents. In general, however, all customary solvents or mixtures thereof that are capable of taking up the components of the silylating solution to give a clear, homogeneous solution having a long shelf-life and which do not react with reactive groups on the polymer or on the silylating agent may be used.

After addition of the amplification agent, a reaction takes place between the anchor group provided on the polymer and the linkage group provided on the amplification agent, with formation of a chemical bond. The nucleophilic group attacks the isocyanate group or thiocyanate group. The nucleophilic group must be such that a sufficiently rapid reaction with the isocyanate group or thiocyanate group is ensured. It is possible in principle to use any desired groups, provided that they have sufficient nucleophilic character with respect to the isocyanate group or thiocyanate group. However, hydroxyl groups, amino groups and thiol groups are particularly suitable. However, CH-acidic compounds, such as, for example, cyanoacetic esters, malononitrile derivatives, and acetylacetone derivatives, may also be reacted with the isocyanate group or the thiocyanate group. The reaction with the isocyanate group or thiocyanate group accordingly gives a urethane group, a urea group, or a thiourea group, via which the amplification agent is linked to the polymer.

In order to accelerate the amplification reaction, a reaction accelerator may be added to the amplification agent. Suitable reaction accelerators are, for example, tertiary amines, such as 1,8-diazabicyclo[5.4.0]undec-7-ene (DBU), 1,5-diazabicyclo[4.3.0]non-5-ene (DBN), 1,4-diazabicyclo[2.2.2]octane (DABCO), tetramethyl-guanidine (TMG), N-dimethylaminopropyl ethyl ether, bis(N-dimethylaminoethyl)methylamine, N-dimethylbenzylamine, N-methyl-N-dimethylaminoethylpiperazine and N-methylmorpholine. Further suitable reaction accelerators are described, for example, in Kleimann, Helmut, Die angewandte makromolekulare Chemie [Applied macromolecular chemistry], 98 (1981) 185–194.

The amplification agent preferably has at least two linkage groups. In this way, further crosslinking of the polymers of the structured resist can be achieved and hence a higher stability of the amplified structure.

As already mentioned, the process according to the invention can be carried out in two ways, these differing in the positioning of isocyanate group or thiocyanate group and nucleophilic group on the polymer and amplification agent, respectively.

According to the first embodiment of the process, the anchor group is in the form of an isocyanate group or thiocyanate group and the linkage group in the form of a nucleophilic group. In this embodiment, the film-forming polymer of the photoresist thus includes the isocyanate groups or thiocyanate groups, while the amplification agent includes nucleophilic groups for linkage to the polymer by reaction with the isocyanate group or thiocyanate group.

In this process variant, the film-forming polymer includes, in addition to the acid-labile groups, repeating units that have an isocyanate group or a thiocyanate group. These repeating units are preferably also formed in such a way that they produce high transparency of the polymer at very short wavelengths of less than 200 nm, preferably less than 160 nm, in particular at 157 nm. Preferred repeating units are shown below as typical examples of the large number of possible repeating units.

wherein,

X is O or S;

$R^2$ is a hydrogen atom or an alkyl group having 1 to 10 carbon atoms, which may be straight-chain or branched and in which one or more hydrogen atoms may have been replaced by fluorine atoms, or is —CN or —$R^3$—C(O)O—$R^4$;

$R^3$ is a single bond, a bivalent alkyl group having 1 to 10 carbon atoms, which may be straight-chain or branched, a bivalent aryl group having 6 to 20 carbon atoms, it also being possible in these groups for one or more hydrogen atoms to have been replaced by fluorine atoms; and

$R^4$ is an alkyl group having 1 to 10 carbon atoms, which may be straight-chain or branched and in which one or more hydrogen atoms may have been replaced by fluorine atoms.

The repeating units can be introduced into the film-forming polymer by copolymerization of corresponding unsaturated monomers. Accordingly, the amplification agent must have a nucleophilic group for linkage to the isocyanate group or thiocyanate group of the polymer. The amplification agent is particularly preferably a nucleophilically functionalized silicon compound, in particular an aminosiloxane. Chain-like dimethylsiloxanes having terminal aminopropy units and 2 to 50, but preferably 2 to 12, silicon atoms per molecule have been proven to be particularly useful. Such a chain-like methylsiloxane is shown below by its general structural formula.

wherein, l preferably is an integer from 1 to 49.

Instead of the methyl groups, other alkyl groups may also be provided in the aminosiloxane, for example ethyl or propyl groups. Further examples of amplification agents having amino-functional groups can be represented by the following general structural formulae.

in which $R^5$ is a hydrocarbon group, n is an integer from 1 to 10, and p is an integer from 1 to 50. Suitable hydrocarbon groups are, for example, linear or branched alkyl groups having, preferably, 1 to 10 carbon atoms, cycloalkyl groups having, preferably, 1 to 20 carbon atoms, it is possible for these groups to include one or more rings, and aryl groups having, preferably, 6 to 20 carbon atoms, that may include one or more aromatic rings that may be fused or may be linked via a single bond or bivalent alkyl groups having 1 to 5 carbon atoms.

According to the second process variant, the process is carried out in such a way that the linkage group is in the form of an isocyanate group or thiocyanate group and the anchor group is in the form of a nucleophilic group. In this process variant, the isocyanate groups or thiocyanate groups are therefore present on the amplification agent, while the nucleophilic groups are bound in the film-forming polymer. In this process variant, the polar groups contained in the acid-labile groups can be used as nucleophilic groups. In addition to repeating units which include the nucleophilic groups in protected form, repeating units that contain the polar groups already in unprotected form, i.e. for example as an amino group or hydroxyl group, may also be contained in the polymer. The repeating units are always such that they produce as little absorption of the film-forming polymer as possible at a very short wavelength, in particular at a wavelength of 157 nm. Exemplary repeating units are shown below.

Z is in general a nucleophilic group, in particular an amino group or a hydroxyl group and n is an integer from 1 to 10. The repeating units can be introduced into the film-forming polymer, for example, by copolymerization of the corresponding unsaturated monomers.

For linkage to the nucleophilic groups of the film-forming polymer, the amplification agent must accordingly have one or more isocyanate groups or thiocyanate groups. If the amplification agent has a plurality of isocyanate groups or thiocyanate groups, additional crosslinking of the film-forming polymer is produced. Typical examples of silicon-containing amplification agents that include isocyanate groups or thiocyanate groups are mentioned below:

$R^5$ has the abovementioned meaning; X is O or S; n is an integer from 1 to 10; and p is an integer from 1 to 50.

Other features that are considered as characteristic for the invention are set forth in the appended claims.

Although the invention is illustrated and described herein as embodied in a process for silylating photoresists in the UV range, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
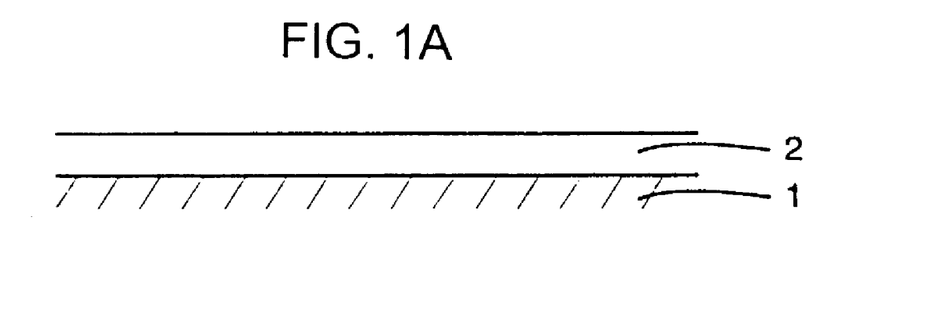
FIGS. 1A–1D are diagrammatic sectional views showing the steps of a process according to the invention.
Figure 1B:
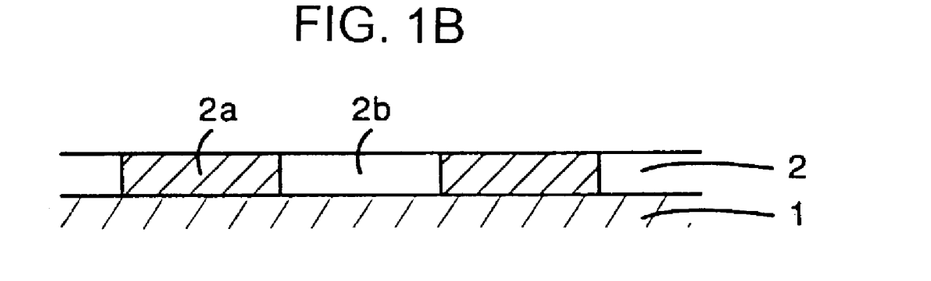
Figure 1C:
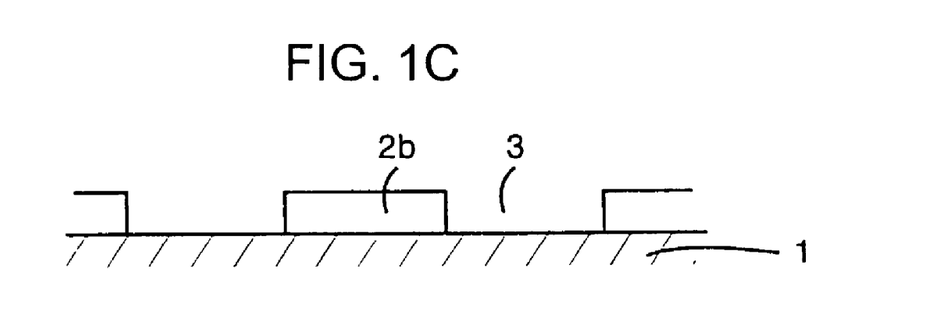
Figure 1D:
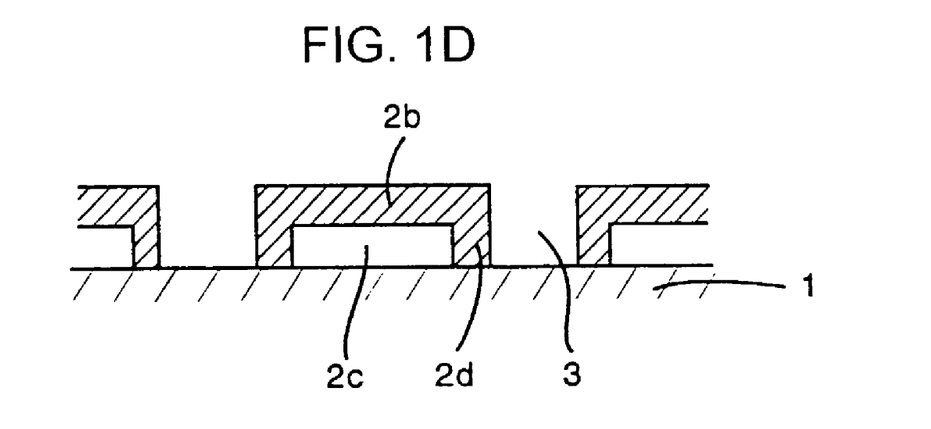

Referring now to the figures of the drawings in detail and first, particularly to FIGS. 1A–1D thereof, there is shown a sequence of process steps that are passed through on carrying out the process according to the invention. First, a photoresist 2 is produced on a substrate 1, as shown in FIG. 1A. The resist film contains a polymer having acid-labile groups and a photo acid generator. In this case, the substrate 1 is, for example, a silicon wafer. The resist film 2 is produced by adding a solution of the photoresist to the substrate 1, for example by spin-coating, and then evaporating the solvent. The resist film 2 is now exposed, an acid being liberated in the exposed parts 2a from the photo acid generator as shown in FIG. 1B, while the resist film remains unchanged in the unexposed parts 2b. This is followed by a heating step (PEB, post exposure bake) in which the acid-labile groups of the polymer are cleaved by the liberated acid in the exposed parts 2a. The exposed resist is then developed with an aqueous alkaline solution, for example a 2.38% strength solution of tetramethylammonium hydroxide in water, the exposed parts 2a, in which the polarity of the polymer contained in the resist is increased, being detached from the substrate 1. As shown in FIG. 1C, the unexposed sections 2b now form raised parts by which the substrate 1 is protected, whereas the exposed parts 2a form trenches 3 in which the substrate 1 is bare. In the parts 2b, the anchor groups are now liberated for linkage of the amplification agent, by first exposing the parts 2b and then heating the substrate with the exposed resist sections 2b. The acid-labile groups of the polymer are now eliminated in the resist structures 2b too and, for example, hydroxyl groups are liberated as anchor groups. A solution of an amplification agent that has isocyanate or thiocyanate groups is then added to the surface of the substrate 1 and of the resist sections 2b. The resist structures 2b are swollen by the solvent so that amplification agent can penetrate and can react with the anchor groups on the polymer. Incorporation of the amplification agent results in growth of the resist sections 2b in the horizontal and vertical direction. The resist structures 2b grow in their dimensions so that the state shown in FIG. 1D is reached. The layer thickness of the raised resist sections 2b has increased and the width of the trenches 3 disposed between the raised resist sections 2b has decreased. The resist structures 2b include a core 2c in which no amplification has taken place since the amplification agent could not diffuse into the interior parts of the resist structure 2b. The core 2c is surrounded by an amplified layer 2d in which silicon-containing groups are linked to the polymer. The resist structure 2d therefore has a greater layer thickness and a smaller width of the trenches 3 compared with the unamplified state shown in FIG. 1C. As a result of the amplified layer 2b, which includes silicon-containing groups, the resist structures acquire increased etch resistance to a plasma, in particular an oxygen plasma. In the subsequent step, the structure of the trenches 3 is transferred by a plasma to the substrate 1.

Figure 2A:
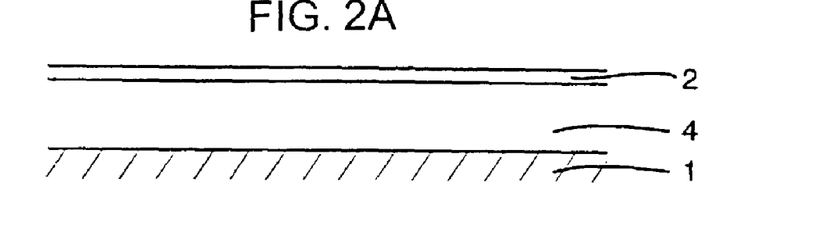
FIG. 2A–2D are diagrammatic sectional views showing the process according to the invention in which a two-layer resist is used.
Figure 2B:
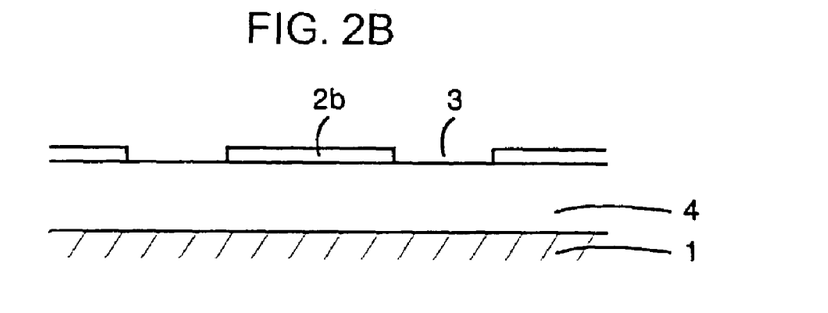
Figure 2C:
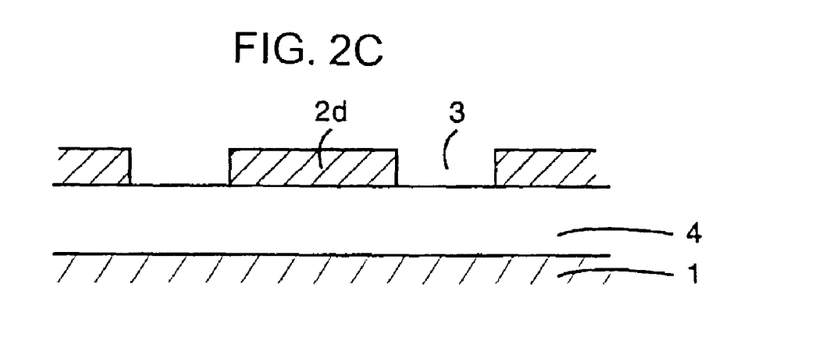
Figure 2D:
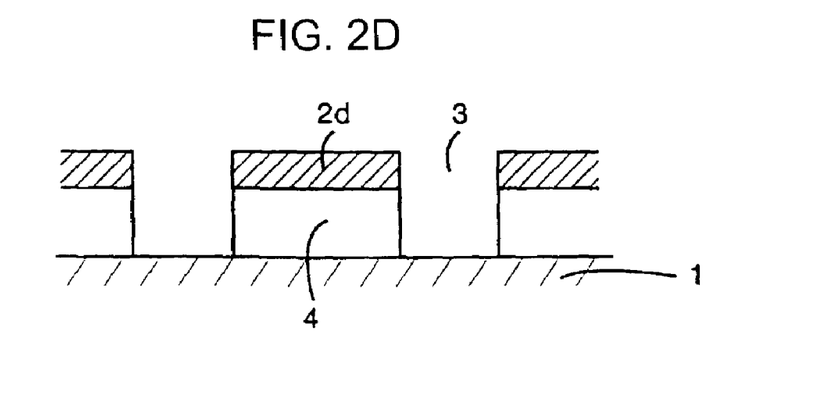

FIGS. 2A–2D show the process sequence for a two-layer resist. This process variant permits the use of very thin layers of the photoresist and exact focusing of short-wave exposure radiation even when no flat surface is available on the substrate owing to the fact that electronic components have already been integrated. The substantial steps of the process correspond to the process sequence shown in FIG. 1. First, a bottom resist 4 which is not photosensitive and is formed, for example, from a novolak resin is applied to a substrate 1. A thin layer of the photoresist 2 is then applied to the layer of the bottom resist 4. The photoresist contains a polymer having acid-labile groups and a photo acid generator. The photoresist layer 2 is now exposed and developed as described in FIGS. 1B and 1C so that a state shown in FIG. 2B is reached. Raised sections 2b have formed on the bottom resist 4, between which sections trenches 3 are disposed. The solution of an amplification agent which includes silicon-containing groups is now applied to the surface of the resist structure 2b and the bare sections of the bottom resist 4. The resist structures 2b are swollen by the solvent so that at the same time the amplification agent can penetrate and reacts with the anchor groups of the polymer contained in the resist. For this purpose, the polymer has isocyanate groups or thiocyanate groups and the amplification agent has a nucleophilic group, for example an amino group. There is an increase in the volume of the resist structures 2b. The increase leads to a substantial film thickness increase. The constriction of the trenches 3 is less pronounced compared to the process shown in FIG. 1, owing to the smaller layer thickness of the photoresist 2. A state shown in FIG. 2C is reached. Amplified sections 2d whose etch resistance to an oxygen plasma has been increased by the introduction of silicon-containing groups have formed on the bottom resist 4. The structure of the trenches 3 is now transferred to the bottom resist 4 by using an oxygen plasma. The bottom resist 4 is removed in the sections of the trenches 3 down to the substrate 1, so that the substrate 1 is bare in the trenches 3, and the trenches 3 are each bounded on both sides by raised parts that are formed in their upper section from a resist amplified by silicon-containing groups and in their lower section by the material of the bottom resist 4, as shown in FIG. 2D. The structure of the trenches 3 can now be etched into the substrate 1 by using a fluorine plasma (not shown).

EXAMPLE 1

Figure 3:
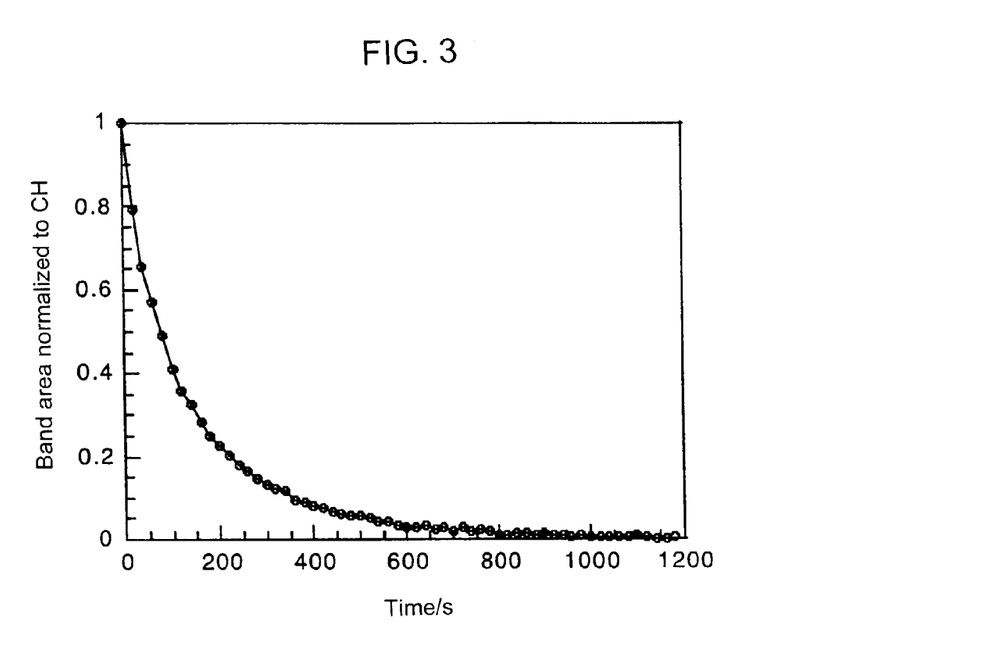
FIG. 3 is a graph plotting decreases in the isocyanate infrared band of the polymer versus reaction time.

To detect the silylation reaction of isocyanates with primary amines, a copolymer including 82 mol % of tert-butyl methacrylate and 18 mol % of isopropenyl isocyanate is dissolved in toluene. The structure of the polymer is shown below:

Bisamino-oligodimethylsiloxanes are added to the solution and the reaction is monitored by infrared spectroscopy. The decrease in the isocyanate band as a function of time is shown in FIG. 3. The intensity plotted along the Y axis corresponds in each case to the integral over the isocyanate band. The decrease in the intensity of the isocyanate band corresponds to the rate of linkage of the amplification agent to the polymer. The reaction takes place rapidly and the intensity of the isocyanate band decreases to as low as 50% of its initial intensity within 100 seconds. The reaction therefore takes place more rapidly than a linkage to carboxylic anhydride groups, so that the process according to the invention permits shorter throughput times together with improved preservation of the resist structures.

EXAMPLE 2

A 200 nm thick layer of the copolymer described in Example 1 is produced on a substrate. A silylation solution that contains 10% by weight of bisamino-oligodimethylsiloxane in heptane is applied to the layer of the copolymer. The amplification reaction is carried out for different reaction times and the film thickness increase of the copolymer film is then determined. After 60 seconds, a film thickness increase of 55 nm is obtained.

In a second experimental series, 0.2% by weight of diazabicycloundecene (DBU) is also added as a catalyst for the silylating solution. As a result, the film thickness increase, measured 60 seconds after addition of the silylating solution, can be increased to 75 nm.

Figure 4:
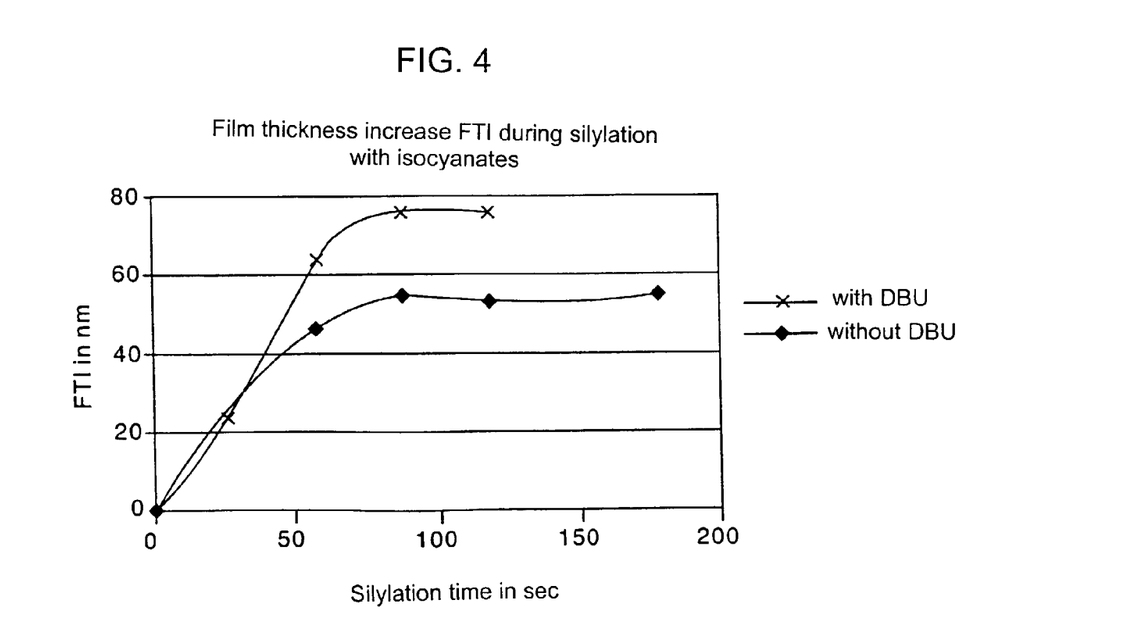
FIG. 4 is a graph plotting increases in film thickness during silylation of a polymer containing isocyanate groups versus time.

The film thickness increases obtained for the two experimental series are shown in FIG. 4 as a function of time. A rapid increase in the film thickness at the beginning of the amplification reaction, which slows down at longer reaction times, is evident. Under catalysis with DBU, greater film thickness increases can be achieved.

We claim:

1. A process for amplifying structured resists, which comprises the following steps:
   applying a chemically amplified photoresist to a substrate, the photoresist including a film-forming polymer, a photoacid generator, and a solvent, the film-forming polymer including acid-labile groups cleavable under acid to liberate groups for increasing solubility of the polymer in aqueous alkaline developers, and an anchor group for linking amplification agents;
   drying the photoresist to give a resist film;
   structuring the resist film to give a structured resist;
   applying an amplification agent in an organic solvent to the structured resist together with a reaction accelerator, the reaction accelerator being a tertiary amine selected from the group consisting of 1,8-diazabicyclo[5.4.0]undec-7-ene (DBU), 1,5-diazabicyclo[4.3.0]non-5-ene (DBN), 1,4-diazabicyclo[2.2.2]octane (DABCO), tetramethyl-guanidine (TMG), N-dimethylaminopropyl ethyl ether, bis(N-dimethylaminoethyl) methylamine, N-dimethylbenzylamine, N-methyl-N-dimethylaminoethylpiperazine and N-methylmorpholine, the amplification agent including a silicon-containing group and a linkage group for linking the amplification agent to the anchor group of the polymer to form a chemical bond between the anchor group and the linkage group and link the amplification agent to the polymer by a covalent bond;
   removing excess amplification agent; and
   forming a pair from the linkage group and the anchor group, one of the linkage group and the anchor group being a group having a structure —N=C=X, with X being a substituent selected from the group consisting of O and S, and the other of the linkage group and the anchor group being a nucleophilic group.

2. The process according to claim 1, which further comprises:
   initially providing the anchor group as a protected anchor group; and
   liberating the anchor group from the protected anchor group.

3. The process according to claim 1, wherein the nucleophilic group is selected from the group consisting of a hydroxyl group, an amino group, and a thiol group.

4. The process according to claim 1, wherein the photoresist includes a thermoacid generator.

5. The process according to claim 2, which further comprises:
   including a thermoacid generator in the resist; and
   heating the structured resist to a temperature liberating an acid from the thermoacid generator in order to liberate the anchor group.

6. The process according to claim 1, which further comprises including at least two linkage groups in the amplification agent.

7. The process according to claim 1, which further comprises exposing the resist film to radiation having a wavelength less than 160 nm.

8. The process according to claim 1, which further comprises adding the amplification agent as a solution to the structured resist.

9. The process according to claim 1, wherein:
   the anchor group on the polymer is selected from the group consisting of an isocyanate group and a thiocyanate group; and
   the linkage group on the amplification agent is the nucleophilic group.

10. The process according to claim 1, wherein:
    the linkage group on the amplification agent is selected from the group consisting of an isocyanate group and a thiocyanate group; and
    the anchor group on the polymer is the nucleophilic group.

* * * * *

UNITED STATES PATENT AND TRADEMARK OFFICE
CERTIFICATE OF CORRECTION

PATENT NO. : 7,045,273 B2
APPLICATION NO. : 10/285050
DATED : May 16, 2006
INVENTOR(S) : Jens Ferbitz

It is certified that error appears in the above-identified patent and that said Letters Patent is hereby corrected as shown below:

Item [75] should read as follows:

Jens Ferbitz, Siegen (D);
Werner Mormann, Siegen (D);
Joerg Rottstegge, Lilienthal (D);
Christoph Hohle, Bubenreuth (D);
Christian Eschbaumer, Schwaig (D);
Michael Sebald, Weisendorf (D);

Signed and Sealed this

Twenty-fourth Day of October, 2006

JON W. DUDAS
*Director of the United States Patent and Trademark Office*